United States Patent
Roh et al.

(10) Patent No.: US 9,210,816 B1
(45) Date of Patent: Dec. 8, 2015

(54) METHOD OF MANUFACTURE OF SUPPORT SYSTEM WITH FINE PITCH

(71) Applicants: YoungDal Roh, Icheon-si (KR); KyoungHee Park, Seoul (KR); Dong Ju Jeon, Seoul (KR); HyungSang Park, Hanam-si (KR)

(72) Inventors: YoungDal Roh, Icheon-si (KR); KyoungHee Park, Seoul (KR); Dong Ju Jeon, Seoul (KR); HyungSang Park, Hanam-si (KR)

(73) Assignee: STATS ChipPAC Ltd., Singapore (SG)

( * ) Notice: Subject to any disclaimer, the term of this patent is extended or adjusted under 35 U.S.C. 154(b) by 90 days.

(21) Appl. No.: 14/132,539

(22) Filed: Dec. 18, 2013

(51) Int. Cl.
*H01L 21/44* (2006.01)
*H05K 3/10* (2006.01)

(52) U.S. Cl.
CPC .................... *H05K 3/101* (2013.01)

(58) Field of Classification Search
CPC .............................. H05K 3/101; H01L 23/535
USPC ........................................................ 438/667
See application file for complete search history.

(56) References Cited

U.S. PATENT DOCUMENTS

| 7,222,421 | B2* | 5/2007 | Nakamura ........................ 29/830 |
| 7,346,982 | B2 | 3/2008 | Kim et al. |
| 7,981,728 | B2 | 7/2011 | Cho |
| 8,207,450 | B2* | 6/2012 | An et al. .......................... 174/261 |
| 8,416,577 | B2* | 4/2013 | Wang et al. ..................... 361/749 |
| 8,569,894 | B2* | 10/2013 | Su et al. ........................... 257/778 |
| 2014/0008814 | A1 | 1/2014 | Chen et al. |

* cited by examiner

*Primary Examiner* — Luan C Thai
(74) *Attorney, Agent, or Firm* — Ishimaru & Associates LLP

(57) ABSTRACT

A method of manufacture of a support system includes: forming a carrier having a detachable core and a carrier foil directly on the detachable core; forming a mask directly on the carrier foil, the mask having a mask hole through the mask; forming a bottom conductive layer within the mask hole and directly on the carrier foil; forming an interior insulation layer directly on the bottom conductive layer and the mask after the bottom conductive layer is formed within the mask hole; partially removing the interior insulation layer leaving an insulation hole through the interior insulation layer; forming a conductive connector completely within the insulation hole; and forming a bottom exterior insulation layer over the bottom conductive layer and the mask.

20 Claims, 5 Drawing Sheets

METHOD OF MANUFACTURE OF SUPPORT SYSTEM WITH FINE PITCH

TECHNICAL FIELD

The present invention relates generally to a method of manufacture of a support system, and more particularly to a support system with fine pitch.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for a method of manufacture of a support system providing integration, space savings, and low cost manufacturing. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a support system, including: forming a carrier having a detachable core and a carrier foil directly on the detachable core; forming a mask directly on the carrier foil, the mask having a mask hole through the mask; forming a bottom conductive layer within the mask hole and directly on the carrier foil; forming an interior insulation layer directly on the bottom conductive layer and the mask after the bottom conductive layer is formed within the mask hole; partially removing the interior insulation layer leaving an insulation hole through the interior insulation layer; and forming a conductive connector completely within the insulation hole.

Certain embodiments of the invention have other steps or elements in addition to or in place of those mentioned above. The steps or the elements will become apparent to those skilled in the art from a reading of the following detailed description when taken with reference to the accompanying drawings.

BEST MODE FOR CARRYING OUT THE INVENTION

Figure 1:
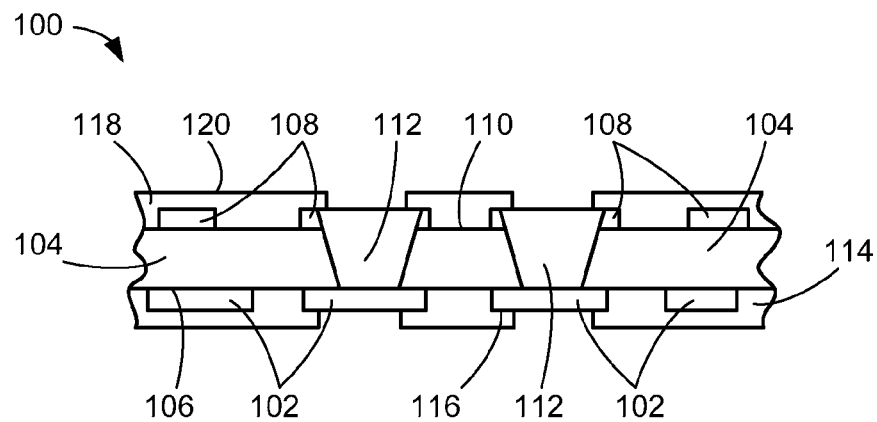
FIG. 1 is a cross-sectional view of a support system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to a plane of a surface of an insulation layer, which will subsequently be described as a structure with prepreg (PPG), regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct physical contact between one element and another element without an intervening element.

The term "processing" as used herein includes deposition of material or photoresist, patterning, exposure, development, etching, cleaning, and/or removal of the material or photoresist as required in forming a described structure.

Figure 2:
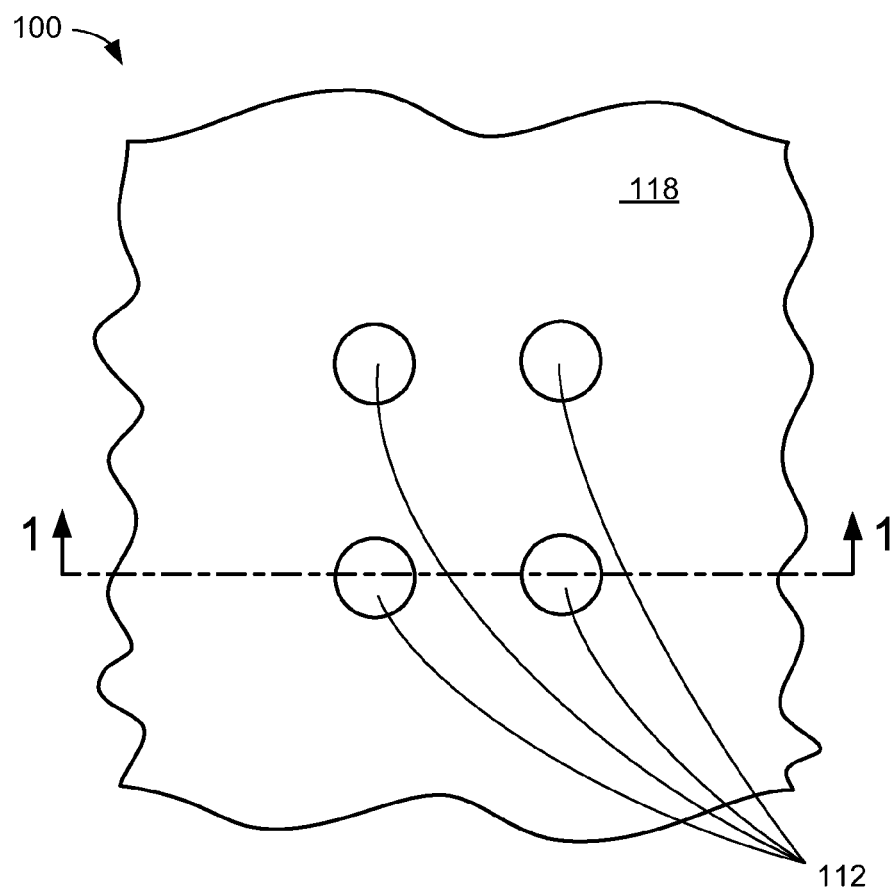
FIG. 2 is a top view of the support system.

Referring now to FIG. 1, therein is shown a cross-sectional view of a support system 100 taken along line 1-1 of FIG. 2 in a first embodiment of the present invention. The cross-sectional view depicts a portion of the support system 100. The support system 100 provides a low cost method of manufacturing fine pitch substrates. The support system 100 provides a process of making coreless substrates having symmetrical 2-layer (2L) structures. For example, the support system 100 provides a manufacturing process, for the coreless substrates, including single metal substrates (SMS) and embedded trace substrates (ETS).

The support system 100 includes a bottom conductive layer 102 and an interior insulation layer 104. The bottom conductive layer 102 is outside of the interior insulation layer 104 and directly on an insulation bottom surface 106 of the interior insulation layer 104. The support system 100 includes a top conductive layer 108 outside of the interior insulation layer 104 and directly on an insulation top surface 110 of the interior insulation layer 104.

The support system 100 includes conductive connectors 112 vertically through the interior insulation layer 104. The conductive connectors 112 are electrically connected to the bottom conductive layer 102 and the top conductive layer 108. The conductive connectors 112 are directly on the bottom conductive layer 102 and the top conductive layer 108.

For illustrative purposes, the conductive connectors 112, the bottom conductive layer 102, and the top conductive layer 108 are shown as a single integral structure, although it is understood that the conductive connectors 112, the bottom conductive layer 102, and the top conductive layer 108 are separate structures that are formed at different times in a manufacture process.

The conductive connectors 112, the bottom conductive layer 102, and the top conductive layer 108 can be formed with any electrically conductive material including a metal and an alloy. The conductive connectors 112, the bottom conductive layer 102, and the top conductive layer 108 can be formed with the same material or different materials. For example, the conductive connectors 112, the bottom conductive layer 102, and the top conductive layer 108 can be formed with a conductive material including copper (Cu).

The support system 100 includes a bottom exterior insulation layer 114 over the bottom conductive layer 102 and the insulation bottom surface 106. The bottom exterior insulation layer 114 is directly on portions of the insulation bottom surface 106 and the bottom conductive layer 102.

The bottom exterior insulation layer 114 exposes portions of the bottom conductive layer 102. The bottom exterior insulation layer 114 partially exposes a bottom layer bottom surface 116 of the bottom conductive layer 102.

The support system 100 includes a top exterior insulation layer 118 over the top conductive layer 108 and the insulation top surface 110. The top exterior insulation layer 118 is directly on portions of the insulation top surface 110 and the top conductive layer 108.

The top exterior insulation layer 118 exposes portions of the top conductive layer 108. The top exterior insulation layer 118 partially exposes a top layer top surface 120 of the top conductive layer 108.

The invention in the support system 100 relates to making low cost substrates. The support system 100 includes a substrate manufacturing process flow for ETS or coreless substrates. However, a metal layer, such as the bottom conductive layer 102, optionally may not be embedded in a dry film (D/F) like in a normal or existing 2L substrate. For example, this structure can optionally be implemented by removing a first metal (M1) layer dry film after seed Cu etching. An M1 layer is embedded in the dry film during a PPG lamination process.

There are several advantages provided by the manufacture of the support system 100. An advantage of a substrate proposed by the support system 100 provides low cost and fine pitch. For example, the support system 100 provides the top conductive layer 108 and the bottom conductive layer 102 having a line or wire width and a line space between lines or wires (LW/LS or L/S) of 15 micrometers (um) and 15 um (15/15), respectively, by applying a manufacture process including EST. The fine pitch refers to LW/LS of 15/15 um or smaller.

Another advantage relates to material cost reduction by replacing copper clad laminate (CCL) with PPG. A further advantage relates to suppression of high temperature strip warpage by a symmetric structure.

A concept of the support system 100 relates to traces, such as those in the top conductive layer 108 and the bottom conductive layer 102, with no Cu trace adhesion issues. A major concern of an ETS structure is higher possibility of non-wet defects compared to a standard Cu pattern structure due to less opportunity of contact between Cu pillars and embedded Cu pads in a PPG resin. It is related to optimize chip attach conditions. Open/short (O/S) defects by the same reason are still higher than normal Cu pattern structures. For example, the non-wet defects are open defects of solder joints.

One of the advantages of the support system 100 mentioned above relates to employing metal layer patterning methods. For substrates with fine L/S, a special material including Primer Coated Copper Foil (PCF) and Ajinomoto build-up film (ABF) is necessary resulting in increased cost. These substrates employ such methods as a subtractive process, a modified semi-additive process (MSAP), and a semi-additive process (SAP).

Although the subtractive process is a simplest process, but it has disadvantages of having a big reduction of Cu width and is employed for an L/S of 40/40 um, which is not applicable for fine pitch substrates with an L/S of 15/15 um. An MSAP method that uses conventional materials has disadvantages of having a medium reduction of Cu width. The MSAP method is employed for an L/S of 25/25 um, which is not applicable for fine pitch substrates with an L/S of 15/15 um.

An SAP method that requires the special material, including ABF or PCF, has disadvantages of having a small reduction of Cu width. The SAP method is employed for an L/S of 20/20 um to 15/15 um, which is not applicable for fine pitch substrates with an L/S of 15/15 um.

The PCF used in the SAP method includes a double-side core of glass, a primer, and Cu foils of 12 micrometers. The ABF is widely used as insulating layers for packaging substrates. The ABF can have a series of very thin film dielectrics made with epoxy/phenol hardener, cyanate ester/epoxy, and cyanate, as examples.

The SAP method includes a vacuum laminator (press type) applied on a substrate carrier. The ABF includes a carrier film or carrier including polyethylene phthalate (PET), an insulating resin layer on the carrier, and a cover layer including oriented polypropylene (OPP).

An advantage of the invention in the support system 100 provides a low cost solution for fine L/S substrates. There is no need for the special material for the fine L/S substrates. Since the special material, including ABF and PCF, is unnecessary, cost is reduced.

Another advantage of the support system 100 is manufacturing cost saving by a dual process as subsequently shown in FIGS. 3-8. Cost is saved by the dual process for a process of making coreless substrates.

A further advantage of the support system 100 is using low cost materials. Normal 2L substrates use CCL, but the coreless substrate proposed by the support system 100 uses PPG, which is used for a dielectric material or the interior insulation layer 104 instead of CCL resulting in cost reduction.

In conclusion, a new coreless structure is proposed by the support system 100 for the low cost fine pitch with an L/S of 15/15. This can be achieved by applying a process that is applicable for ETS for forming an embedded pattern in the bottom conductive layer 102 or the top conductive layer 108. The new coreless structure provides high temperature warpage reduction by the symmetric structure.

Referring now to FIG. 2, therein is shown a top view of the support system 100. A portion of the support system 100 is shown in the top view. The top view depicts the conductive connectors 112 exposed from the top exterior insulation layer 118.

Figure 3:
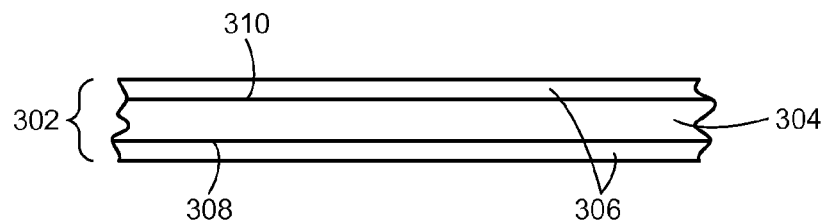
FIG. 3 is a cross-sectional view of the support system of FIG. 1 in a carrier preparation phase of manufacture.

Referring now to FIG. 3, therein is shown a cross-sectional view of the support system 100 of FIG. 1 in a carrier preparation phase of manufacture. The cross-sectional view depicts a portion of the support system 100 in the carrier preparation phase. The support system 100 includes a carrier 302 having a detachable core 304.

The carrier 302 includes a carrier foil 306 formed directly on the detachable core 304. The carrier foil 306 is a layer of conductive material including copper or any other metal or alloy. In FIGS. 3-7, the support system 100 includes the dual process, in which a development occurs on both a core bottom surface 308 and a core top surface 310 of the detachable core 304. For example, FIG. 3 depicts the carrier foil 306 and another of the carrier foil 306 formed directly on the core bottom surface 308 and the core top surface 310, respectively.

Figure 4:
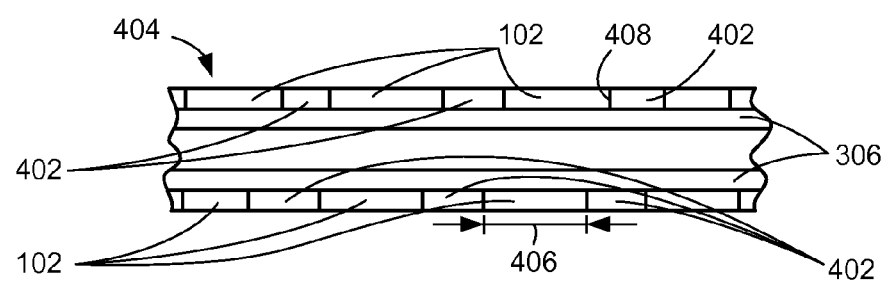
FIG. 4 is the structure of FIG. 3 in a first conductor formation phase.

Referring now to FIG. 4, therein is shown the structure of FIG. 3 in a first conductor formation phase. The first conductor formation phase includes a lamination of a mask 402. The mask 402 is a structure having an insulation material including a dry film. For example, the mask 402 can be a photoresist mask, a positive resist mask, or a mask resistant to a photo-imageable process.

The mask 402 is formed directly on the carrier foil 306. The mask 402 is developed to have a pattern with mask holes 404 through the mask 402. The first conductor formation phase includes formation of the bottom conductive layer 102 within the mask holes 404. The mask holes are shown having hole widths 406.

The bottom conductive layer 102 can be formed by plating a conductive material, including copper (Cu) or any other metal or alloy, directly on a foil top surface of the carrier foil 306 and a mask non-horizontal surface 408 of the mask 402. The M1 layer previously described refers to the bottom conductive layer 102. The bottom conductive layer 102 is embedded or fixed firmly and securely in the mask 402.

Figure 5:
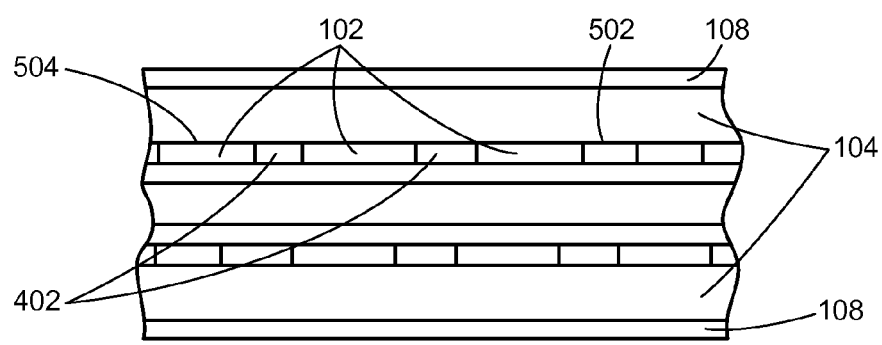
FIG. 5 is the structure of FIG. 4 in a lamination phase.

Referring now to FIG. 5, therein is shown the structure of FIG. 4 in a lamination phase. The lamination phase includes a lamination of the interior insulation layer 104 over the mask 402 and the bottom conductive layer 102. The interior insulation layer 104 is formed directly on a mask top surface 502 of the mask 402 and a bottom layer top surface 504 of the bottom conductive layer 102. The interior insulation layer 104 is a structure having an insulator including PPG or any other insulation materials.

Instead of stripping the mask 402, including a dry film, as in a normal ETS process, the lamination of the interior insulation layer 104 occurs immediately after the first conductor formation phase. The mask 402 can optionally be stripped or removed as subsequently described in FIG. 11.

The interior insulation layer 104 can be an insulator including a prepreg, which includes a reinforcing material impregnated with resin prior to a molding process and cured by an application of heat. The top conductive layer 108 is formed directly on the interior insulation layer 104. The top conductive layer 108 includes a conductor including a metal such as copper. The top conductive layer 108 includes a structure of a foil.

Figure 6:
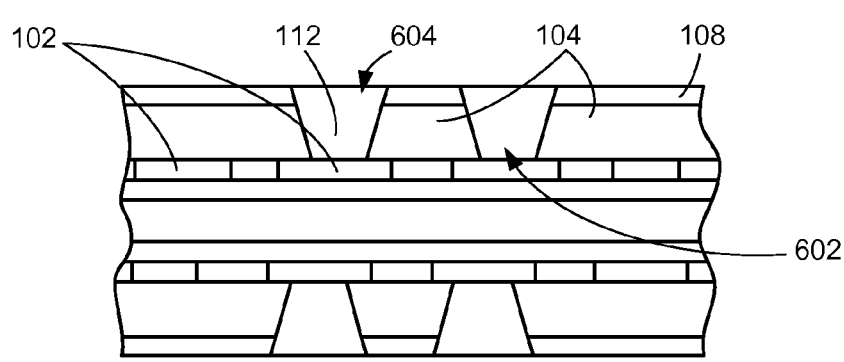
FIG. 6 is the structure of FIG. 5 in a second conductor formation phase.

Referring now to FIG. 6, therein is shown the structure of FIG. 5 in a second conductor formation phase. The interior insulation layer 104 and the top conductive layer 108 are partially removed leaving insulation holes 602 in and through the interior insulation layer 104, and conductor holes 604 in and through the top conductive layer 108.

The insulation holes 602 and the conductor holes 604 are used to form the conductive connectors 112. The conductive connectors 112 are vertically through and completely within the insulation holes 602 and the conductor holes 604. The conductive connectors 112 electrically connect the bottom conductive layer 102 and the top conductive layer 108.

For example, the insulation holes 602 and the conductor holes 604 are formed by a removal process including drilling or any other removal methods. Also for example, the conductive connectors 112 are formed by a conductor formation process including plating.

Figure 7:
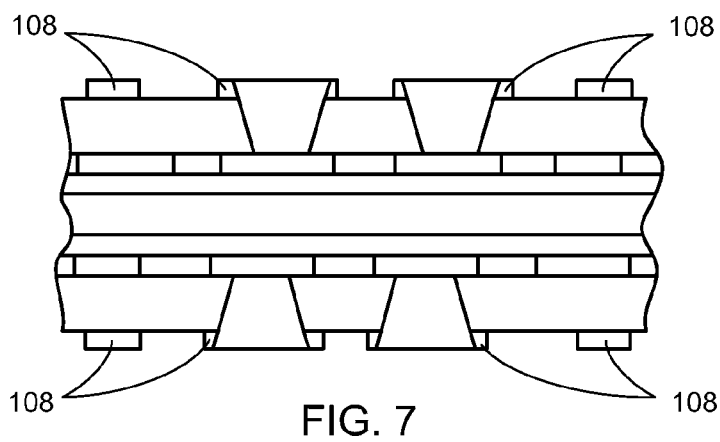
FIG. 7 is the structure of FIG. 6 in a patterning phase.

Referring now to FIG. 7, therein is shown the structure of FIG. 6 in a patterning phase. The top conductive layer 108 is patterned leaving connections or traces that provide electrical connectivity. The top conductive layer 108 is patterned using a removal process including etching.

Figure 8:
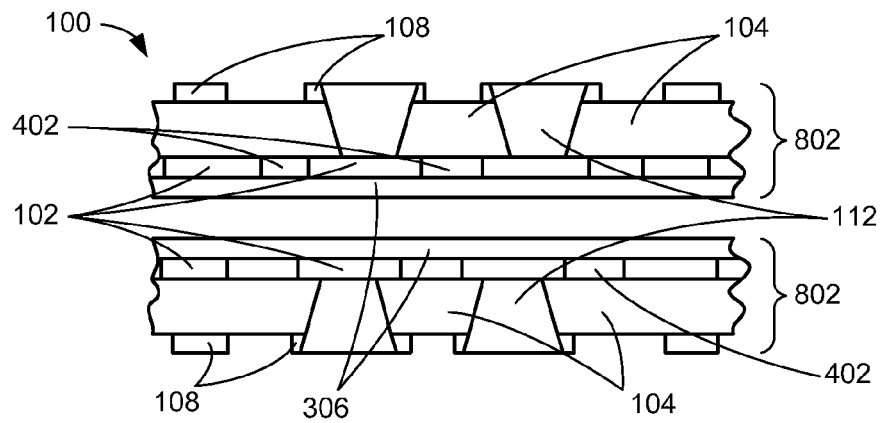
FIG. 8 is the structure of FIG. 7 in a detachment phase.

Referring now to FIG. 8, therein is shown the structure of FIG. 7 in a detachment phase. The detachment phase includes removal or separation of the detachable core 304 of FIG. 3, forming substantially similar lower and upper subassemblies 802. The subassemblies 802 are substantially similar because they are developed using substantially the same processes as previously described in FIGS. 3-7.

The core bottom surface 308 of FIG. 3 is separated from the carrier foil 306 and the core top surface 310 of FIG. 3 is separated from another of the carrier foil 306. One of the subassemblies 802 is directly on the core bottom surface 308 and another of the subassemblies 802 is directly on the core top surface 310 as previously shown in FIG. 7. Each of the subassemblies 802 includes the carrier foil 306, the mask 402, the bottom conductive layer 102, the interior insulation layer 104, the top conductive layer 108, and the conductive connectors 112.

It has been discovered that the method of manufacture of the support system 100 developed with the subassemblies 802 further improves reliability using the dual process because the subassemblies 802 attached below and above the detachable core 304 provides the symmetric structure that suppresses the high temperature strip warpage.

Figure 9:
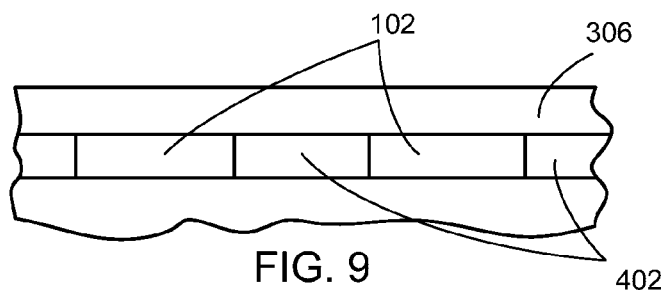
FIG. 9 is a detailed cross-sectional view of a portion of the structure of FIG. 8.

Referring now to FIG. 9, therein is shown a detailed cross-sectional view of a portion of the structure of FIG. 8. The detailed cross-sectional view depicts the lowest of two of the subassemblies 802 of FIG. 8. The portion of the structure of FIG. 8 is shown before a phase of manufacture subsequently described in FIG. 10. The carrier foil 306 is over and directly on the bottom conductive layer 102 and the mask 402.

Figure 10:
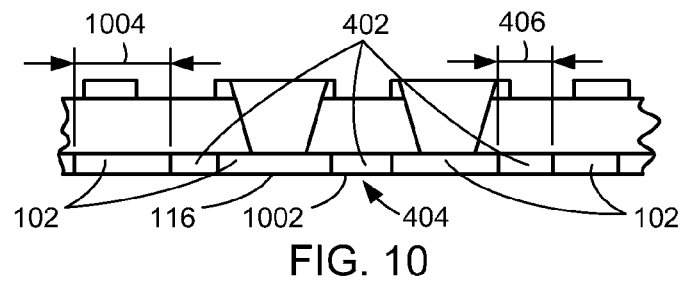
FIG. 10 is the structure of FIG. 8 in a first removal phase.

Referring now to FIG. 10, therein is shown the structure of FIG. 8 in a first removal phase. The carrier foil 306 of FIG. 3 is removed, exposing a mask bottom surface 1002 of the mask 402 and the bottom layer bottom surface 116 of the bottom conductive layer 102.

For example, the carrier foil 306 represents a conductive structure including a seed copper. Also for example, the first removal phase includes a removal process including etching.

When the carrier foil 306 is removed, conductive layer widths 1004 of portions of the bottom conductive layer 102 that are within the mask holes 404 are preserved. The conductive layer widths 1004 preserved refers to the conductive layer widths 1004 approximately the same as the hole widths 406 of the mask holes 404 without any impact of the removal of the carrier foil 306.

It has been discovered that the method of manufacture of the bottom conductive layer 102 embedded in the mask 402 or within the mask holes 404 provides an advantage of preserving the structure of the bottom conductive layer 102. Such preservation is provided during the first removal phase because there are no reductions in the conductive layer widths 1004 of the portions of the bottom conductive layer 102 that are within the mask holes 404. As a result, the support system 100 of FIG. 1 is applicable for the fine pitch substrates with the L/S of 15/15 um or smaller.

Figure 11:
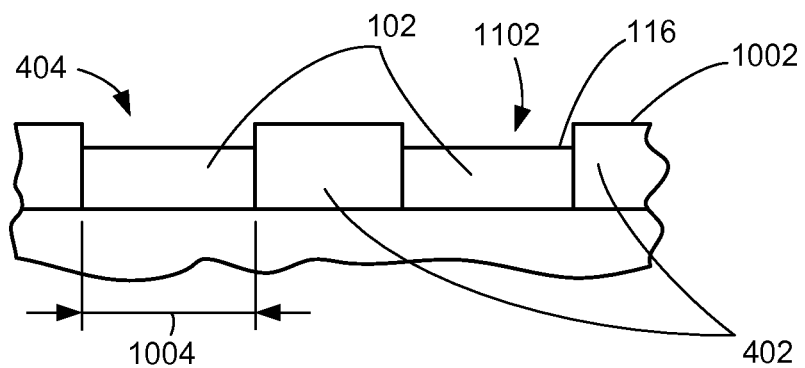
FIG. 11 is a detailed cross-sectional view of a portion of the structure of FIG. 10.

Referring now to FIG. 11, therein is shown a detailed cross-sectional view of a portion of the structure of FIG. 10. The detailed cross-sectional view depicts the portion of the structure of FIG. 10 after the first removal phase.

A top portion of the bottom conductive layer 102 can be removed, resulting in the bottom layer bottom surface 116 below than the mask bottom surface 1002 to form a recess 1102 bounded by the bottom conductive layer 102 and the mask 402. However, the conductive layer widths 1004 of the portions of the bottom conductive layer 102 are preserved. These portions are within the mask holes 404 and exposed from the mask 402. The conductive layer widths 1004 are preserved because the portions formed within the mask holes 404 are protected by the mask 402.

In FIG. 11, the bottom layer bottom surface 116 of the bottom conductive layer 102 can optionally be horizontal to or coplanar with the mask bottom surface 1002 of the mask 402. For example, a removal process including etching can be precisely controlled to form the bottom layer bottom surface 116 horizontal to or coplanar with the mask bottom surface 1002.

It has been discovered that the method of manufacture of the bottom conductive layer 102 formed within the mask holes 404 are applicable for the fine pitch substrates with the L/S of 15/15 um or smaller. Such applicability is provided because the conductive layer widths 1004 of the portions of the bottom conductive layer 102 formed within the mask holes 404 are preserved since there is no reduction in the conductive layer widths 1004.

It has also been discovered that the method of manufacture including the removal of the top portion of the bottom conductive layer 102 provides improved reliability for attaching the bottom conductive layer 102 and an external connector of the next level system. The removal of the top portion of the bottom conductive layer 102 results in the bottom layer bottom surface 116 below than the mask bottom surface 1002. In this case, the external connector is reliably and firmly attached to the bottom conductive layer 102 within the recess 1102.

Figure 12:
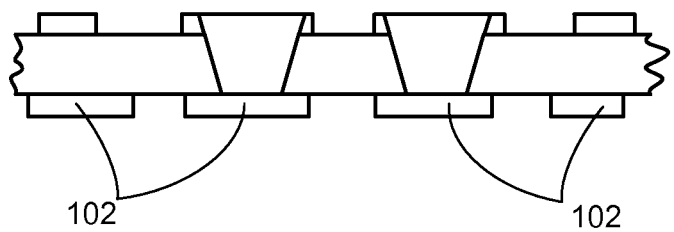
FIG. 12 is the structure of FIG. 10 in a second removal phase.

Referring now to FIG. 12, therein is shown the structure of FIG. 10 in a second removal phase. The second removal phase is optional after the first removal phase. The mask 402 of FIG. 4 can optionally be removed.

When the mask 402 is not stripped or removed as subsequently described in FIG. 14, the mask 402 provides further protection to the bottom conductive layer 102. In such case, the second removal phase is eliminated from the manufacture of the support system 100 of FIG. 1.

Figure 13:
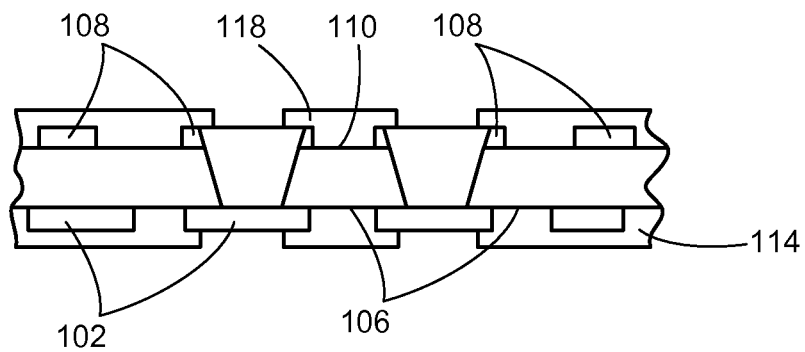
FIG. 13 is the structure of FIG. 11 in an insulation formation phase.

Referring now to FIG. 13, therein is shown the structure of FIG. 11 in an insulation formation phase. The bottom exterior insulation layer 114 is formed over the bottom conductive layer 102 and the insulation bottom surface 106.

The bottom exterior insulation layer 114 exposes portions of the bottom conductive layer 102. The bottom exterior insulation layer 114 is formed directly on a portion of the insulation bottom surface 106 exposed in the space without the mask 402 of FIG. 4 after the second removal phase.

The top exterior insulation layer 118 is formed over the top conductive layer 108 and the insulation top surface 110. The top exterior insulation layer 118 exposes portions of the top conductive layer 108. The bottom exterior insulation layer 114 and the top exterior insulation layer 118 include an insulator including solder resist (SR) or any other dielectrics.

Figure 14:
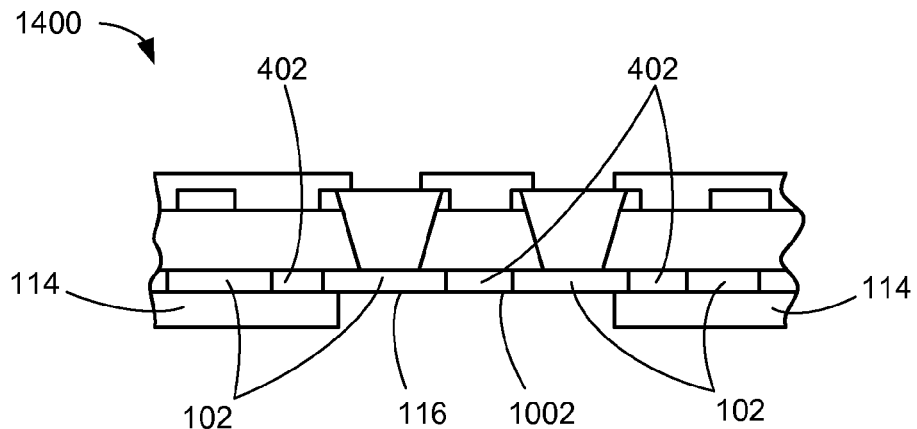
FIG. 14 is a cross-sectional view of a support system in a second embodiment of the present invention.

Referring now to FIG. 14, therein is shown a cross-sectional view of a support system 1400 in a second embodiment of the present invention. The support system 1400 is similar to the support system 100 of FIG. 1, except that the mask 402 is not removed in the second removal phase and the formation of the bottom exterior insulation layer 114 is different.

The bottom conductive layer 102 is embedded or firmly and securely fixed in the mask 402. The bottom exterior insulation layer 114 is directly on the mask bottom surface 1002 of the mask 402.

The bottom exterior insulation layer 114 exposes portions of the bottom conductive layer 102 and the mask 402. The bottom exterior insulation layer 114 partially exposes the bottom layer bottom surface 116 and the mask bottom surface 1002 of the mask 402.

For illustrative purposes, the bottom exterior insulation layer 114 exposes two immediately adjacent portions of the bottom conductive layer 102, although it is understood that the bottom exterior insulation layer 114 can expose any number of the immediately adjacent portions of the bottom conductive layer 102.

For example, the bottom exterior insulation layer 114 including SR can usually be used as a passivation for a metal including copper (Cu). Also for example, the bottom exterior insulation layer 114 is opened to interconnect the bottom conductive layer 102 with conductive connectors, including solder balls or solder bumps, of an electrical component including a chip.

It has been discovered that the method of manufacture of the support system 1400 having the mask 402 provides further protection to the bottom conductive layer 102, thereby resulting in improved reliability. The improved reliability is provided because immediately after the first removal phase, the mask 402 is not removed to embed or firmly and securely fix the bottom conductive layer 102 in the mask 402, thus eliminating the bottom conductive layer 102 from being pulled out.

Figure 15:
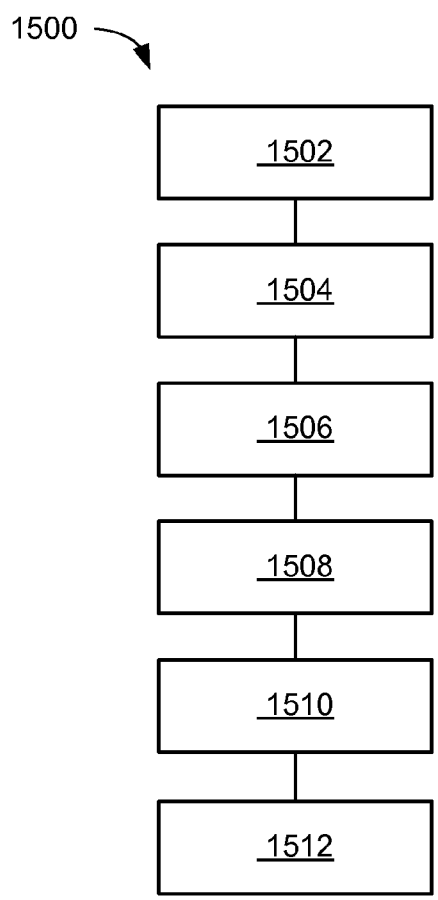
FIG. 15 is a flow chart of a method of manufacture of a support system in a further embodiment of the present invention.

Referring now to FIG. 15, therein is shown a flow chart of a method 1500 of manufacture of a support system in a further embodiment of the present invention. The method 1500 includes: forming a carrier having a detachable core and a carrier foil directly on the detachable core in a block 1502; forming a mask directly on the carrier foil, the mask having a mask hole through the mask in a block 1504; forming a bottom conductive layer within the mask hole and directly on the carrier foil in a block 1506; forming an interior insulation layer directly on the bottom conductive layer and the mask after the bottom conductive layer is formed within the mask hole in a block 1508; partially removing the interior insulation layer leaving an insulation hole through the interior insulation layer in a block 1510; and forming a conductive connector completely within the insulation hole in a block 1512.

Thus, it has been discovered that the method of manufacture of the support system of the present invention furnishes important and heretofore unknown and unavailable solutions, capabilities, and functional aspects for a support system with fine pitch. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing support systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a support system comprising:
   forming a carrier having a detachable core and a carrier foil directly on the detachable core;
   forming a mask directly on the carrier foil, the mask having a mask hole through the mask;
   forming a bottom conductive layer within the mask hole and directly on the carrier foil;
   forming an interior insulation layer directly on the bottom conductive layer and the mask after the bottom conductive layer is formed within the mask hole;
   forming a top conductive layer on the interior insulation layer;
   partially removing the interior insulation layer leaving an insulation hole through the interior insulation layer; and
   forming a conductive connector completely within the insulation hole and directly on the top conductive layer.

2. The method as claimed in claim 1 further comprising separating the detachable core from the carrier foil.

3. The method as claimed in claim 1 further comprising removing the carrier foil to expose a portion of the bottom conductive layer.

4. The method as claimed in claim 1 wherein forming the top conductive layer includes forming the top conductive layer directly on the interior insulation layer.

5. The method as claimed in claim 1 further comprising forming a bottom exterior insulation layer over the bottom conductive layer.

6. A method of manufacture of a support system comprising:
   forming a carrier having a detachable core and a carrier foil directly on the detachable core;
   forming a mask directly on the carrier foil, the mask having a mask hole through the mask;
   forming a bottom conductive layer within the mask hole and directly on the carrier foil;
   forming an interior insulation layer directly on the bottom conductive layer and the mask after the bottom conductive layer is formed within the mask hole;
   forming a top conductive layer directly on the interior insulation layer;
   partially removing the top conductive layer leaving a conductor hole through the top conductive layer;
   partially removing the interior insulation layer leaving an insulation hole through the interior insulation layer; and
   forming a conductive connector completely within the insulation hole and the conductor hole and directly on the top conductive layer.

7. The method as claimed in claim 6 further comprising forming substantially similar subassemblies by separating the detachable core from the carrier foil.

8. The method as claimed in claim 6 further comprising removing the carrier foil to expose a portion of the bottom conductive layer within the mask hole, wherein a width of the portion of the bottom conductive layer is preserved after the carrier foil is removed.

9. The method as claimed in claim 6 wherein forming the conductive connector includes forming the conductive connector on the bottom conductive layer and the top conductive layer.

10. The method as claimed in claim 6 further comprising:
    removing the mask to expose a portion of an insulation bottom surface of the interior insulation layer; and
    forming a bottom exterior insulation layer over the bottom conductive layer and the insulation bottom surface.

11. A method of manufacture of a support system comprising:
    forming a carrier having a detachable core and a carrier foil directly on the detachable core;
    forming a mask directly on the carrier foil, the mask having a mask hole through the mask;
    forming a bottom conductive layer within the mask hole and directly on the carrier foil;
    forming an interior insulation layer directly on the bottom conductive layer and the mask after the bottom conductive layer is formed within the mask hole;
    forming a top conductive layer on the interior insulation layer;
    partially removing the interior insulation layer leaving an insulation hole through the interior insulation layer;

forming a conductive connector completely within the insulation hole and directly on the top conductive layer; and forming a bottom exterior insulation layer over the bottom conductive layer and the mask.

12. The method as claimed in claim 11 further comprising separating the detachable core from the carrier foil.

13. The method as claimed in claim 11 further comprising removing the carrier foil to expose a portion of the bottom conductive layer.

14. The method as claimed in claim 11 wherein forming the top conductive layer includes forming the top conductive layer directly on the interior insulation layer.

15. The method as claimed in claim 11 wherein forming the bottom exterior insulation layer includes forming the bottom exterior insulation layer directly on the bottom conductive layer.

16. The method as claimed in claim 11 further comprising:
    partially removing the top conductive layer leaving a conductor hole through the top conductive layer; and
    wherein:
       forming the top conductive layer includes forming the top conductive layer directly on the interior insulation layer; and
       forming the conductive connector includes forming the conductive connector completely within the insulation hole and the conductor hole.

17. The method as claimed in claim 16 further comprising forming substantially similar subassemblies by separating the detachable core from the carrier foil.

18. The method as claimed in claim 16 further comprising removing the carrier foil to expose a portion of the bottom conductive layer within the mask hole, wherein a width of the portion of the bottom conductive layer is preserved after the carrier foil is removed.

19. The method as claimed in claim 16 wherein forming the conductive connector includes forming the conductive connector on the bottom conductive layer and the top conductive layer.

20. The method as claimed in claim 16 wherein forming the bottom exterior insulation layer includes forming the bottom exterior insulation layer directly on the bottom conductive layer and the mask, the bottom exterior insulation layer exposes portions of the bottom conductive layer and the mask.

* * * * *